(12) United States Patent
Zhang et al.

(10) Patent No.: US 11,462,517 B2
(45) Date of Patent: Oct. 4, 2022

(54) LIGHT-EMITTING DIODE DEVICE AND WHITE LIGHT EMITTING SYSTEM

(71) Applicant: XIAMEN SANAN OPTOELECTRONICS TECHNOLOGY CO., LTD., Xiamen (CN)

(72) Inventors: Ping Zhang, Xiamen (CN); Junpeng Shi, Xiamen (CN); Senpeng Huang, Xiamen (CN); Zhen-duan Lin, Xiamen (CN); Shunyi Chen, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 16/899,413

(22) Filed: Jun. 11, 2020

(65) Prior Publication Data
US 2020/0303358 A1  Sep. 24, 2020

Related U.S. Application Data

(63) Continuation-in-part of application No. PCT/CN2018/116768, filed on Nov. 21, 2018.

(30) Foreign Application Priority Data

Dec. 21, 2017  (CN) .................... CN201711397732.9

(51) Int. Cl.
*H01L 33/48* (2010.01)
*H01L 25/075* (2006.01)
*H01L 33/50* (2010.01)

(52) U.S. Cl.
CPC ........ *H01L 25/0753* (2013.01); *H01L 33/483* (2013.01); *H01L 33/504* (2013.01); *H01L 33/507* (2013.01)

(58) Field of Classification Search
CPC .................................. F21K 9/64; F21V 13/14
See application file for complete search history.

(56) References Cited

U.S. PATENT DOCUMENTS 8,053,970 B2 * 11/2011 Kimura .............. C09K 11/7774
313/501
8,704,440 B2 * 4/2014 Zheng ................ C09K 11/7774
313/503
(Continued)

FOREIGN PATENT DOCUMENTS

CN  1542990 A  11/2004
CN  1866550 A  11/2006
(Continued)

OTHER PUBLICATIONS

Xizhen Chen, "Theory and Application of Modern Statistical Analysis Method", National Defense Industry Press, May 2016, p. 53.
(Continued)

*Primary Examiner* — Andrew J Coughlin
(74) *Attorney, Agent, or Firm* — Thomas | Horstemeyer, LLP

(57) ABSTRACT

A light-emitting diode (LED) device includes a base plate, an LED chip unit disposed on the base plate, and a light conversion layer disposed on and covering the LED chip unit. The LED chip unit includes a first chip and a second chip. The first chip emits a first excitation light having an emission peak wavelength ranging from 385 nm to 425 nm. The second chip emits a second excitation light having an emission peak wavelength greater than that of the first excitation light. The light conversion layer is configured to convert the first and second excitation lights to excited lights
(Continued)

having different emission peak wavelengths, each of which ranges from 440 nm to 700 nm. A mixture of the excited lights is white light.

19 Claims, 13 Drawing Sheets

(56) References Cited

U.S. PATENT DOCUMENTS

| | | | | |
|---|---|---|---|---|
| 8,877,524 | B2* | 11/2014 | Chitnis | H01L 33/508 |
| | | | | 438/14 |
| 9,206,947 | B2* | 12/2015 | Baumgartner | F21V 9/38 |
| 9,312,246 | B2* | 4/2016 | Roth | C09K 11/7734 |
| 9,423,118 | B2* | 8/2016 | Mori | H01L 33/56 |
| 9,890,930 | B2* | 2/2018 | Tien | F21V 9/30 |
| 10,455,773 | B2* | 10/2019 | Amiya | A01G 7/045 |
| 2003/0122482 | A1* | 7/2003 | Yamanaka | H01L 33/501 |
| | | | | 313/512 |
| 2004/0207313 | A1* | 10/2004 | Omoto | C09K 11/7729 |
| | | | | 313/503 |
| 2014/0159595 | A1* | 6/2014 | Sutardja | H05B 45/24 |
| | | | | 315/192 |
| 2017/0014538 | A1* | 1/2017 | Rantala | H01L 25/0753 |

FOREIGN PATENT DOCUMENTS

| | | |
|---|---|---|
| CN | 104025322 A | 9/2014 |
| CN | 108183099 A | 6/2018 |
| DE | 202015105686 U1 | 1/2017 |

OTHER PUBLICATIONS

Search Report appended to an Office Action, which was issued to Chinese counterpart application No. 201711397732.9 by the CNIPA dated May 5, 2019, with an English translation thereof.
Search Report appended to an Office Action, which was issued to Chinese counterpart application No. 201711397732.9 by the CNIPA dated Dec. 12, 2019, with an English translation thereof.
Search Report appended to an Office Action, which was issued to Chinese counterpart application No. 201711397732.9 by the CNIPA dated Jun. 9, 2020, with an English translation thereof.
Search Report issued to PCT application No. PCT/CN2018/116768 by the CNIPA dated Feb. 21, 2019.

* cited by examiner

LIGHT-EMITTING DIODE DEVICE AND WHITE LIGHT EMITTING SYSTEM

CROSS-REFERENCE TO RELATED APPLICATION

This application is a bypass continuation-in-part (CIP) application of PCT International Application No. PCT/CN2018/116768, filed on Nov. 21, 2018, which claims priority of Chinese invention Patent Application No. 201711397732.9, filed on Dec. 21, 2017. The entire content of each of the International and Chinese patent applications is incorporated herein by reference.

FIELD

This disclosure relates to a light-emitting diode (LED) device, and more particularly to an LED device that emits white light.

BACKGROUND

A light-emitting diode (LED) device is a solid-state lighting device made of semiconductor materials. Referring to FIG. 1, a conventional white light LED device includes a blue LED chip 100 which is configured to emit a blue excitation light so as to excite green and red phosphors disposed on the blue LED chip 110. The excited lights emitted from the green and red phosphors (i.e., green and red lights respectively denoted as G and R in FIG. 1) may be mixed with each other to form white light. However, the conventional white-light LED device might suffer from severe blue light hazard due to the blue LED chip 100 thereof, and the thus obtained white light may have a discontinuous light emission spectrum, causing certain color rendering indices (e.g., $R_{10}$ and $R_{12}$) to be lower than 90 (see FIG. 2).

To solve the abovementioned problems, referring to FIG. 3, another conventional white light LED device includes a violet LED chip 101 instead of the blue LED chip, which is configured to emit a violet excitation light to excite red, green, and blue phosphors 102 disposed on the violet chip 101. The resultant excited lights are mixed to form white light having a continuous light emission spectrum similar to that of natural light (see FIG. 4). However, a Stokes loss caused by phosphor conversion of the violet excitation light into red or green excited light might be relatively high due to a great difference between wavelengths of the violet excitation light and the red or green excited light, such that the light extraction efficiency of such conventional white light LED device may be greatly decreased.

SUMMARY

Therefore, an object of the disclosure is to provide a light-emitting diode (LED) device and a white-light emitting system that can alleviate or eliminate at least one of the drawbacks of the prior art.

According to the disclosure, the LED device includes a base plate, an LED chip unit disposed on the base plate, and a light conversion layer which is disposed on and covers the LED chip unit.

The LED chip unit includes a first chip and a second chip. The first chip emits a first excitation light having an emission peak wavelength ranging from 385 nm to 425 nm. The second chip emits a second excitation light having an emission peak wavelength greater than that of the first excitation light.

The light conversion layer is configured to convert the first and second excitation lights to excited lights having different emission peak wavelengths, each of which ranges from 440 nm to 700 nm. A mixture of the excited lights is white light.

According to the disclosure, the white light emitting system includes the abovementioned LED device.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
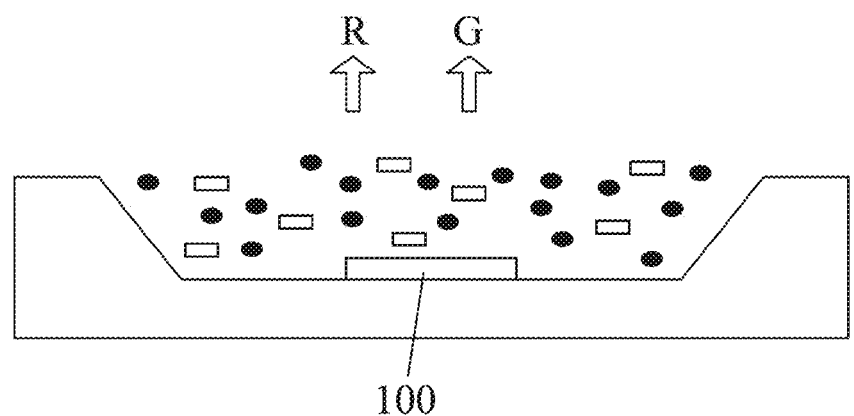
FIG. 1 is a schematic cross-sectional view illustrating a conventional white light light-emitting diode (LED) device.

Unless otherwise defined, all technical and scientific terms used herein have the meaning commonly understood by a person skilled in the art to which this disclosure belongs. One skilled in the art will recognize many methods and materials similar or equivalent to those described herein, which could be used in the practice of this disclosure. Indeed, this disclosure is in no way limited to the methods and materials described.

Before the disclosure is described in greater detail, it should be noted that where considered appropriate, reference numerals have been repeated among the figures to indicate corresponding or analogous elements, which may optionally have similar characteristics.

Figure 5:
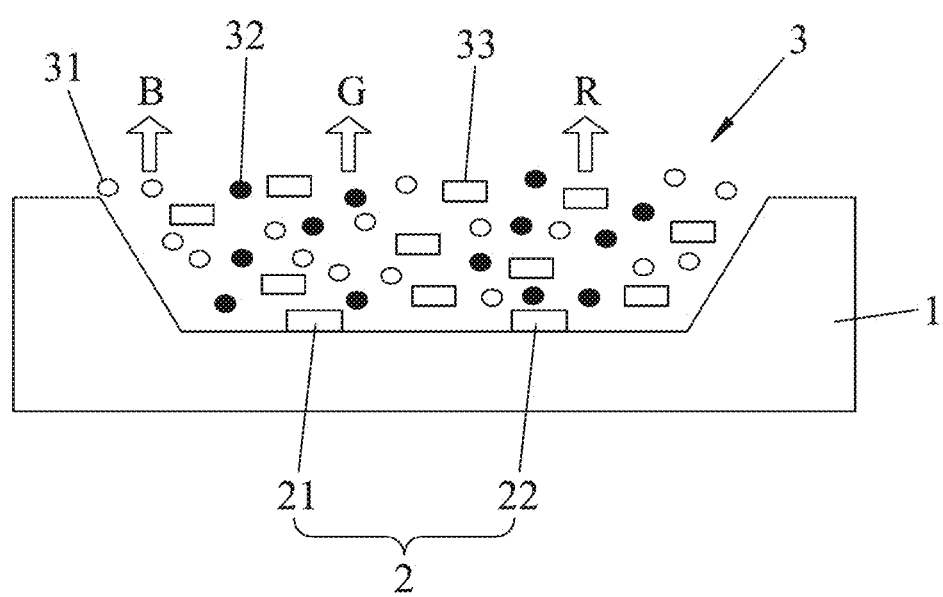
FIG. 5 is a schematic cross-sectional view illustrating a first embodiment of an LED device of the disclosure.

Referring to FIG. 5, a first embodiment of a light-emitting diode (LED) device according to the disclosure includes a base plate 1, a LED chip unit 2 disposed on the base plate 1, and a light conversion layer 3 disposed on and covering the LED chip unit 2.

The base plate 1 may be a multi-layered varistor or a multi-layered ceramic capacitor, and may be made of a material which has resistance against surge and electrostatic discharge. Exemplary materials suitable for making the base plate 1 may include, but are not limited to, zinc oxide, a zinc oxide-based material doped with other metals, zicronates (e.g., $CaSrZrO_3$), and titanates (e.g., $BaTiO_3$ and $BaSrTiO_3$).

The LED chip unit 2 includes a first chip 21 and a second chip 22. The first chip 21 emits a first excitation light having an emission peak wavelength ranging from 385 nm to 425 nm, and the second chip 22 emits a second excitation light having an emission peak wavelength greater than that of the first excitation light (e.g., 440 nm to 460 nm). In certain embodiments, the emission peak wavelength of the first excitation light ranges from 400 nm to 425 nm, and the emission peak wavelength of the second excitation light is greater than 425 nm and not greater than 460 nm.

In this embodiment, the first chip 21 is a violet chip which emits the first excitation light having an emission peak wavelength ranging from 410 nm to 420 nm, and the second chip 22 is a blue chip which emits the second excitation light having an emission peak wavelength ranging from 445 nm to 460 nm. The first and second chips 21, 22 of the LED chip unit 2 may be provided independently in a form of a flip LED chip, a face-up LED chip, a vertical LED chip, a high-voltage LED chip, etc. In this embodiment, the first and second chips 21, 22 are flip LED chips.

The light conversion layer 3 is configured to convert the first and second excitation lights to excited lights having different emission peak wavelengths, each of which ranges from 440 nm to 700 nm. A mixture of the excited lights is white light.

In certain embodiments, the excited lights include a first excited light and a second excited light. The light conversion layer 3 includes a first light conversion material 31 that is excited by the first excitation light to emit the first excited light, and a second light conversion material 33 that is excited by the second excitation light to emit the second excited light. The first excited light may have an emission peak wavelength ranging from 440 nm to 600 nm, and the second excited light may have an emission peak wavelength ranging from 500 nm to 700 nm.

The excited lights may further include a third excited light, and the light conversion layer 3 may further include a third conversion material 32 which is excited by one of the first and second excitation lights to emit the third excited light having an emission peak wavelength different from those of the first and second excited lights. In certain embodiments, the emission peak wavelength of the first excited light ranges from 450 nm to 500 nm, the emission peak wavelength of the second excited light is greater than 500 nm and not greater than 600 nm, and the emission peak wavelength of the third excited light is greater than 600 nm and not greater than 700 nm. Each of the excited lights may have a full width half maximum that ranges from 30 nm to 80 nm.

In certain embodiments, not greater than 50% of one of the first, second and third excited lights emitted from the first, second, and third light conversion materials 31, 33, 32 is absorbed by another one of the first, second, and third light conversion materials 31, 33, 32. At least one of the second and third light conversion materials 33, 32 may have an excitation efficiency of not greater than 70% at an excitation wavelength that is equal to the emission peak wavelength of the first excitation light, and an excitation efficiency of greater than 80% at an excitation wavelength that is equal to the emission peak wavelength of the second excitation light.

In this embodiment, the excited lights include the first, second and third excited lights, and the light conversion layer 3 includes a blue phosphor serving as the first light conversion material 31, a red phosphor serving as the second light conversion material 33, and a green phosphor serving as the third light conversion material 33, which are well mixed and fully covering the first and second chips 21, 22.

The blue phosphor may be excited by an excitation light having an emission peak wavelength lower than 420 nm, such as 390 nm (i.e., the first excitation light emitted by the first chip 21) to emit the first excited light having an emission peak wavelength of 460 nm (i.e., blue light shown as "B" in the figures).

The red phosphor may be an AEC:$Eu^{2+}$ phosphor, in which AE represents calcium (Ca) and/or strontium (Sr). When AE is calcium, the red phosphor 33 can be excited by an excitation light having an emission peak wavelength of 450 nm (i.e., the second excitation light emitted by the second chip 22) to emit the second excited light having an emission peak wavelength of greater than 600 nm (such as 600 nm to 700 nm, i.e., red light shown as "R" in the figures) in a relatively high excitation efficiency (e.g., higher than 80%). In contrast, when the red phosphor is excited by an excitation light having an emission wavelength ranging from 410 nm to 420 nm, the resultant excitation efficiency is relatively low (e.g., lower than 70%).

The green phosphor may be an $Lu_3Al_5O_{12}$:$Ce^{3+}$ (LuAG: Ce) phosphor. Since LuAG barely absorbs violet light (absorption rate far lower than 50%), the green phosphor can be excited by an excitation light having an emission wavelength of 450 nm (i.e., the second excitation light emitted by the second chip 22) to emit the third excited light having an emission peak wavelength of approximately 550 nm (i.e., green light shown as "G" in the figures).

Figure 2:
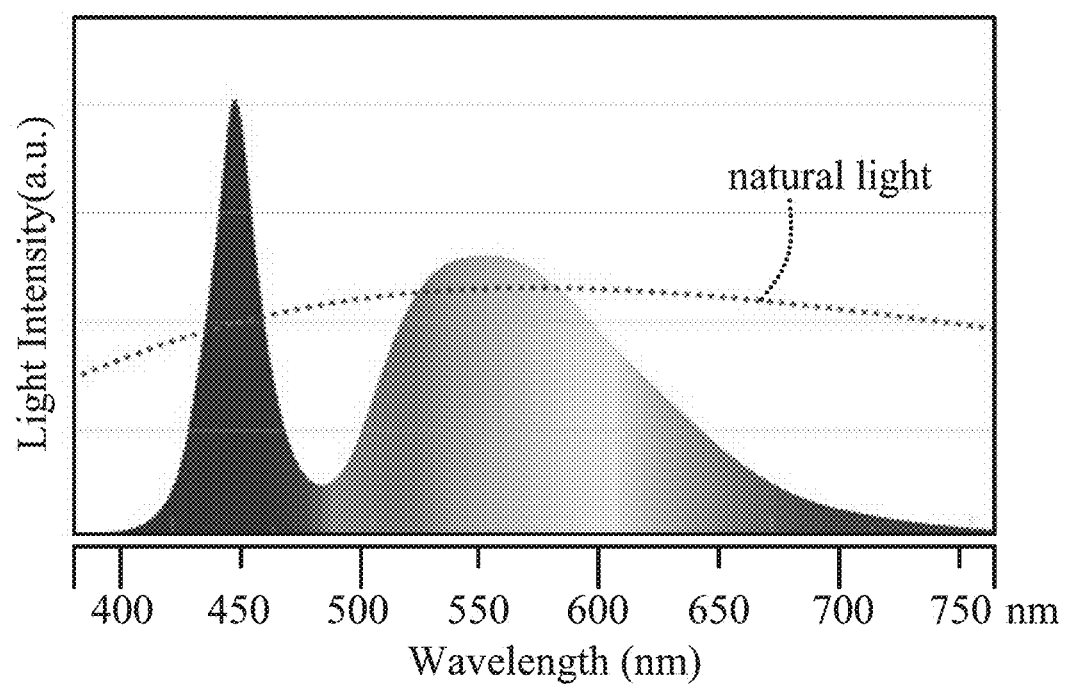
FIG. 2 is a graph illustrating light emission spectra of white light emitted by the conventional white light LED device of FIG. 1 and natural light, in which the light emission spectra are plots of the light intensity (in arbitrary units, denoted as "a.u.") of white light and natural light as a function of wavelengths (in nm)
Figure 6:
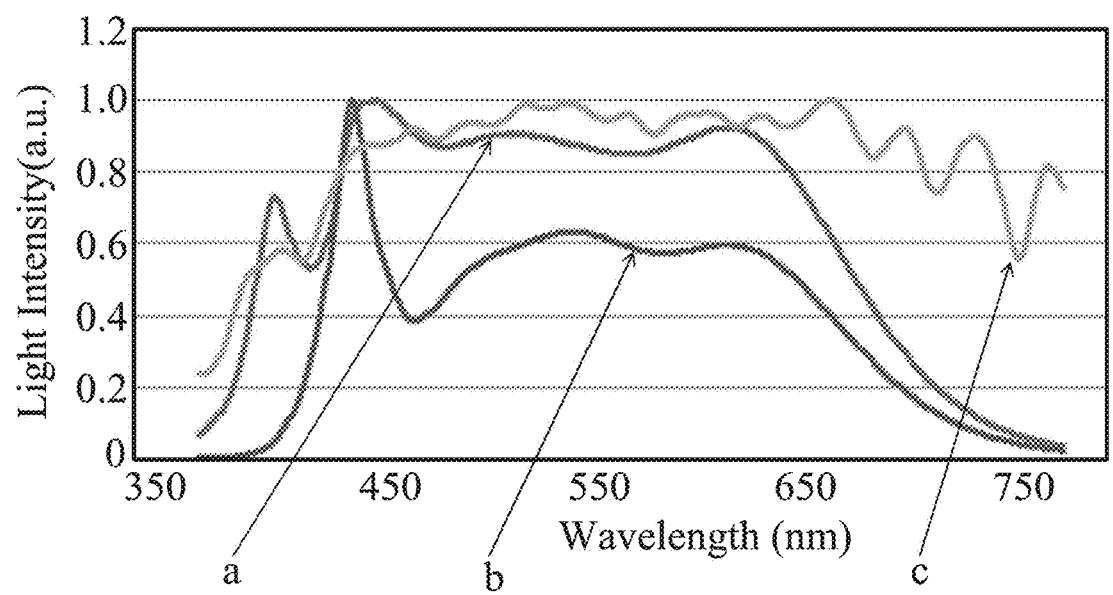
FIG. 6 is a graph illustrating light emission spectrums of white lights emitted by the first embodiment (curve "a") and an LED device of a Comparative example (CE 1) (curve "b"), and a light emission spectrum of a black-body radiation having a same color temperature as that of the white light emitted by the first embodiment (curve "c")

As shown in FIG. 6, the first embodiment emits the white light having a continuous light emission spectrum (curve "a") similar to that of natural light shown in FIG. 2. In contrast, an LED device of a Comparative example 1 (CE 1), which is similar to the first embodiment except that only the blue chip is used in CE 1, emits white light having a relatively discontinuous light emission spectrum (curve "b").

In certain embodiments, assuming that the light emission spectrum of the white light emitted by the LED device of this disclosure is P(λ), and the light emission spectrum of the black-body radiation having a same color temperature as that of the white light is B(λ) (i.e., curve "c" shown in FIG. 6), a degree of similarity between P(λ) and B(λ), which is determined by measuring cosine of an angle (θ) between a spectral vector of P(λ) and a spectral vector of B(λ) within an emission wavelength range (λ) from 380 nm to 780 nm, satisfies relational equations of:

$$\cos\theta > 0.9 \text{ and } \frac{|P(\lambda)|}{|B(\lambda)|} > 0.75, \text{ where}$$

$$\cos\theta = \frac{|P(\lambda) \cdot B(\lambda)|}{|P(\lambda)||B(\lambda)|} = \frac{\sum_{380}^{780} P(\lambda)B(\lambda)}{\sqrt{\sum_{380}^{780} P(\lambda)^2} \sqrt{\sum_{380}^{780} P(\lambda)^2}}.$$

In other embodiments, the degree of similarity between P(λ) and B(λ), which may also be determined by measuring cosine of an angle (α) between a spectral vector of P(λ) and a spectral vector of B(λ) within an emission wavelength range (λ) from 510 nm to 610 nm (i.e., a wavelength range corresponding to a range of full width half maximum of human photopic luminosity function V(λ)), satisfies relational equations of:

$$\cos\alpha > 0.99 \text{ and } \frac{|P(\lambda)|}{|B(\lambda)|} > 0.9 \text{ where}$$

$$\cos\alpha = \frac{\sum_{510}^{610} P(\lambda)B(\lambda)}{\sqrt{\sum_{510}^{610} P(\lambda)^2} \sqrt{\sum_{510}^{610} P(\lambda)^2}}.$$

For comparison, a degree of similarity between the light emission spectrum of white light emitted by the LED device of CE 1 and B(λ) is also determined using the methods as mentioned above. The results are presented in Table 1.

TABLE 1

| Determined emission wavelength range (nm) | Degree of similarity | First embodiment | CE 1 |
|---|---|---|---|
| 380 to 780 | cos (θ) | 0.925 | 0.852 |
|  | $\frac{|P(\lambda)|}{|B(\lambda)|}$ | 0.751 | 0.529 |
| 510 to 610 | cos (α) | 0.999 | 0.984 |
|  | $\frac{|P(\lambda)|}{|B(\lambda)|}$ | 0.941 | 0.853 |

Figure 7:
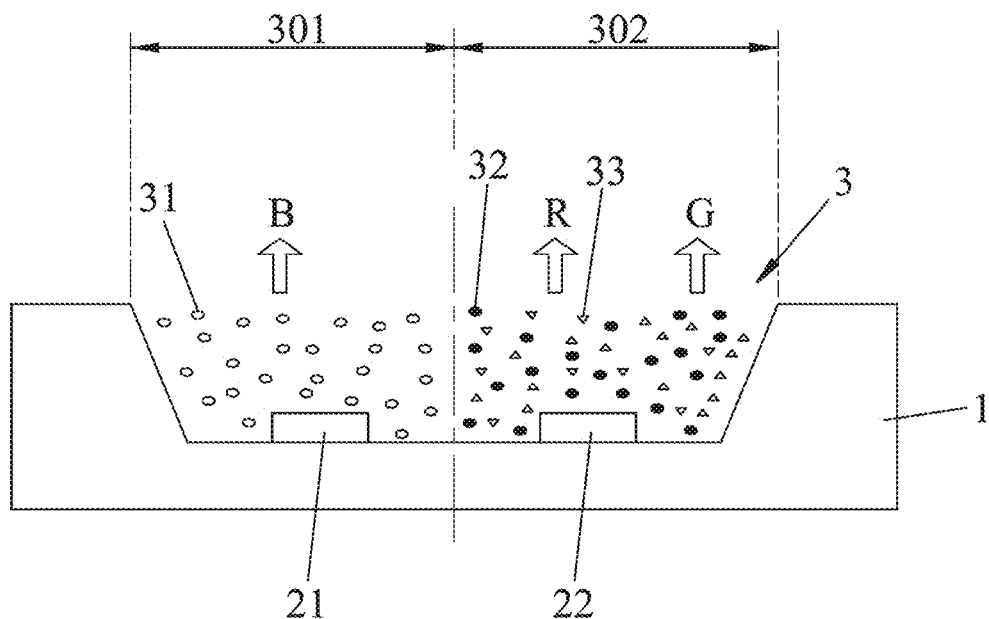
FIG. 7 is a schematic cross-sectional view illustrating a second embodiment of the LED device of the disclosure.

As shown in Table 1, when measured within the emission wavelength range of 380 nm to 780 nm, the cos(θ) and the ratio between absolute values of P(λ) and B(λ) of the first embodiment are greater than those of CE 1, and closer to 1. Similarly, when measured within the emission wavelength range of 510 nm to 610 nm, the cos (α) and the ratio between absolute values of P(λ) and B(λ) of the first embodiment are also greater than those of CE 1, and closer to 1. These results indicate that the first embodiment of the LED device is capable of emitting white light which is more similar to natural light as compared to CE 1. Therefore, the LED device according to this disclosure may be manufactured into a white light emitting system that is suitable for serving as a searchlight or a signal light of transportation vehicles to be used on land, in air, or in water. In addition, the white light emitting system may be used in daily life, for example, as a backlight of liquid crystal displays and lighting equipments (such as flashes of cameras and cell phones) Referring to FIG. 7, a second embodiment of the LED device according to the disclosure is similar to the first embodiment, except that the light conversion layer 3 has a first region 301 disposed above and corresponding in position to the first chip 21 and a second region 302 disposed above and corresponding in position to the second chip 22. The first region 301 is excited by the first excitation light to emit at least one of the excited lights having an emission wavelength ranging from 440 nm to 600 nm, and the second region 302 is excited by the second excitation light to emit at least one of the excited lights having an emission wavelength ranging from 500 nm to 700 nm.

In this embodiment, the first region 301 includes the first light conversion material 31 (i.e., the blue phosphor), and the second region 302 includes the second light conversion material 33 (i.e., the red phosphor) and the third light conversion material 32 (i.e., the green phosphor or a green-yellow phosphor). That is, the blue phosphor in the first region 31 is disposed above and corresponds in position to the first chip 21, and the green phosphor and the red phosphor mixed in the second region 302 are disposed above and correspond in position to the second chip 22.

In certain embodiments, assuming that the light emission spectrum of the white light emitted by the LED device of this disclosure is P(λ), the light emission spectrum of a black-body radiation having a same color temperature as that of the white light is B (λ), a maximum light intensity of the white light within an emission wavelength range of 380 nm to 780 nm is P($\lambda_{max}$), and a maximum light intensity of the black-body radiation within the emission wavelength range of 380 nm to 780 nm is B($\lambda_{max}$), $D_1(\lambda)$, which represents a difference between P(λ) and B(λ) measured within an emission wavelength range (λ) from 510 nm to 610 nm, satisfies a relationship of $-0.15<D_1(\lambda)<0.15$, where $$D_1(\lambda) = \frac{P(\lambda)}{P(\lambda_{max})} - \frac{B(\lambda)}{B(\lambda_{max})}.$$

Figure 8:
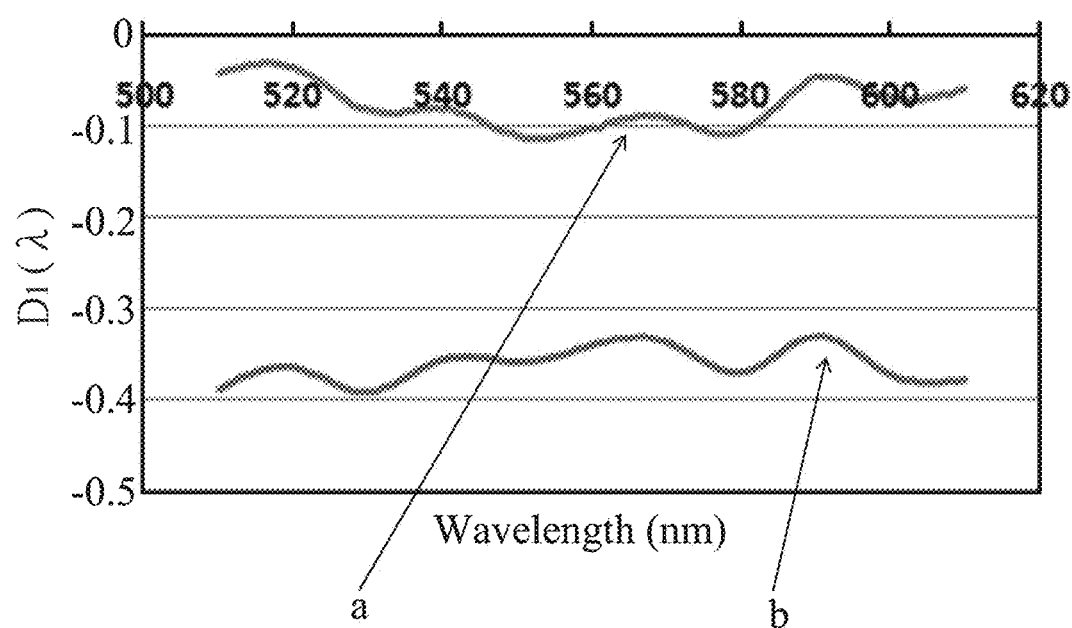
FIG. 8 is a graph illustrating $D_1(\lambda)$ curves of the second embodiment (curve "a") and CE 1 (curve "b"), in which $D_1(\lambda)$, measured within an emission wavelength range ($\lambda$) from 510 nm to 610 nm, represents a difference between a light emission spectrum of white light emitted by the second embodiment and a light emission spectrum of a black-body radiation having a same color temperature as that of the white light emitted by the second embodiment.

Referring to FIG. 8, $D_1(\lambda)$ of the second embodiment (curve "a") is within a range of 0 to −0.15, while $D_1(\lambda)$ of CE 1 (curve "b") ranges from −0.4 to −0.3, which is larger than that of the second embodiment.

In certain embodiments, when measured within a wavelength range (λ) from 400 nm to 500 nm, the difference between P(λ) and B(λ), i.e., $D_2(\lambda)$, satisfies a relationship of $-0.25<D_2(\lambda)<0.25$, where $$D_2(\lambda) = \frac{P(\lambda)}{P(550 \text{ nm})} - \frac{B(\lambda)}{B(550 \text{ nm})}.$$

Figure 9:
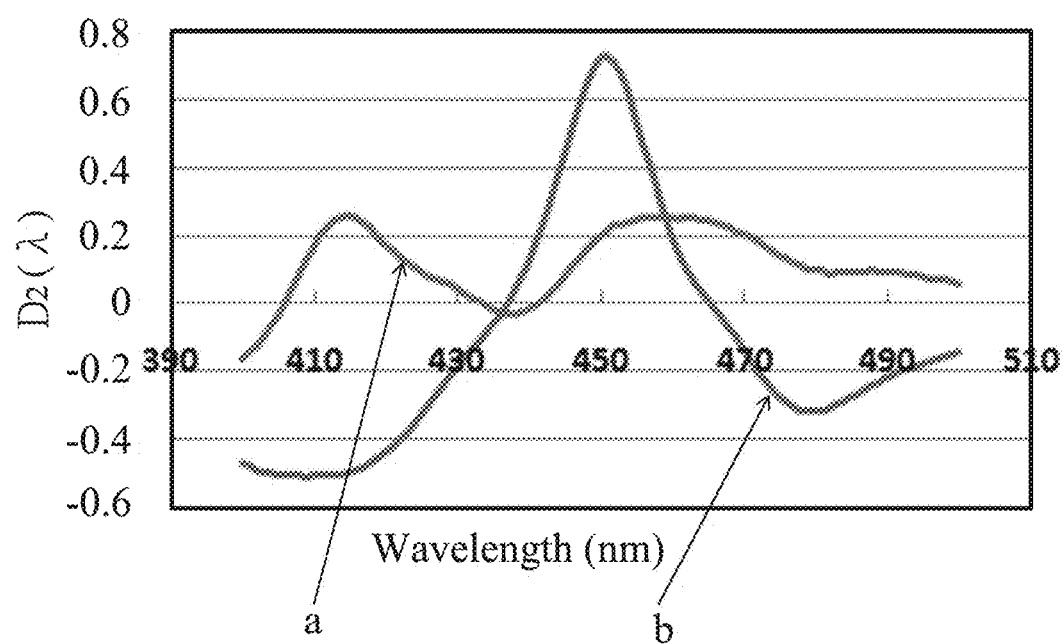
FIG. 9 is a graph illustrating $D_2(\lambda)$ curves of the second embodiment (curve "a") and CE 1 (curve "b"), in which $D_2(\lambda)$, measured within an emission wavelength range ($\lambda$) from 400 nm to 500 nm, represents a difference between the light emission spectrum of the second embodiment and the light emission spectrum of the black-body radiation.

Referring to FIG. 9, $D_2(\lambda)$ of the second embodiment (curve "a") is within a range of −0.2 to 0.25, while $D_2(\lambda)$ of CE 1 (curve "b") ranges from −0.5 to +0.7, which is larger than that of the second embodiment.

Figure 3:
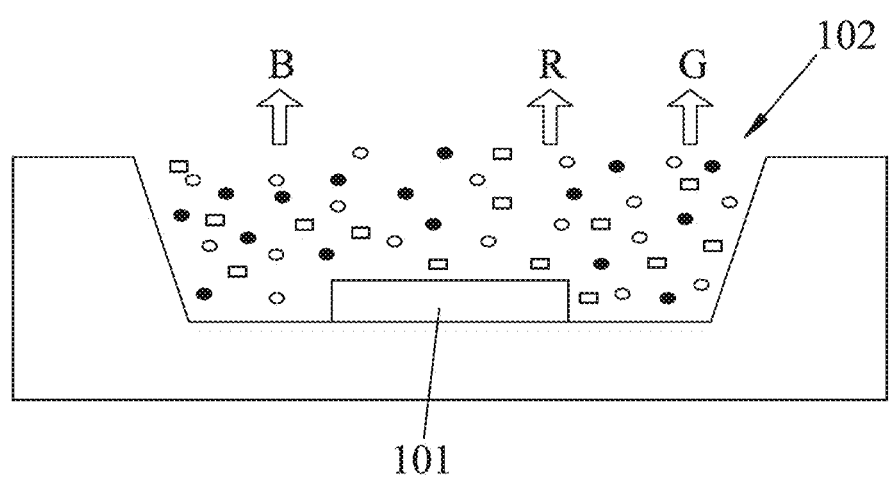
FIG. 3 is a schematic cross-sectional view illustrating another conventional white light LED device.
Figure 4:
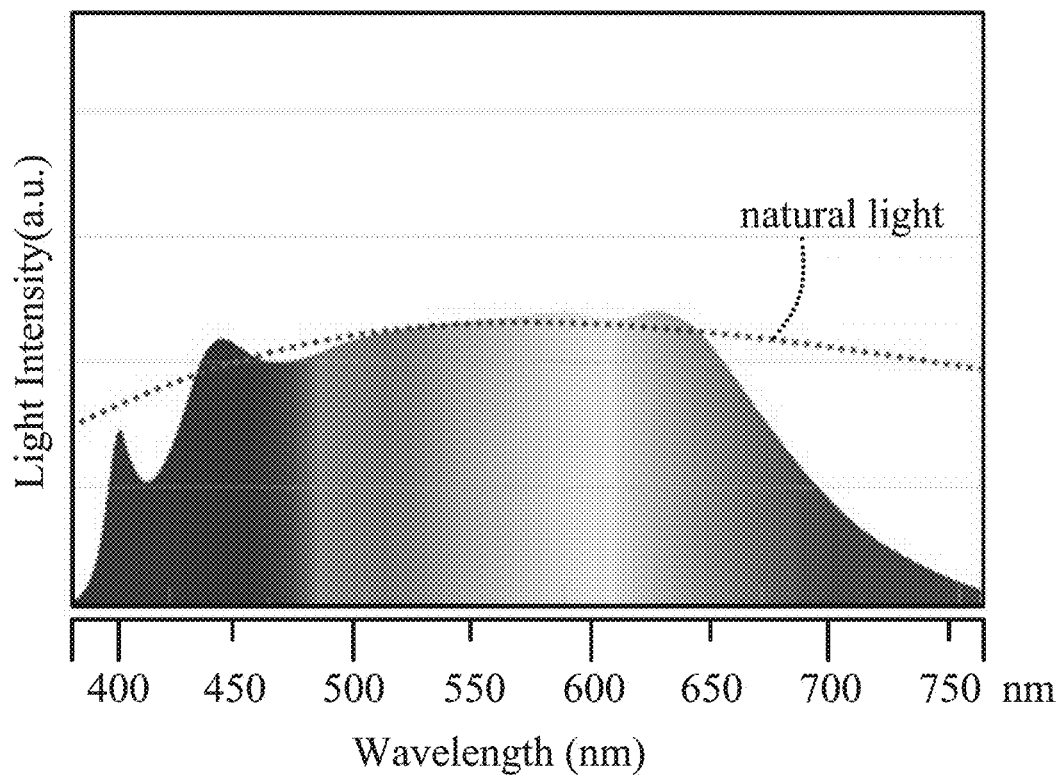
FIG. 4 is a graph illustrating light emission spectra of white light emitted by the conventional white light LED of FIG. 3 and natural light.

The above results indicate that the white light emitted by the second embodiment of the LED device is more similar to natural light as compared to the white light emitted by CE 1. That is, as compared to the conventional white light LED device having only the blue chip (such as CE1 or the one shown in FIG. 1), the second embodiment of the LED device of this disclosure including both the violet LED chip (i.e., the first chip 21) and the blue LED chip (i.e., the second chip 22) has a more continuous light emission spectrum, less severe blue light hazard caused by the blue LED chip, and improved color rendering indices (e.g., all of R1 to R15 being greater than 90). In addition, as compared to the conventional white light LED device having only the violet chip (such as the one shown in FIG. 3) with a reduced luminous efficiency, by covering the first chip 21 and the second chip 22 respectively with predetermined light conversion materials to emit excited lights having excellent excitation efficiency, the second embodiment of the LED device may have a reduced Stokes loss and a higher light extraction efficiency.

Figure 10:
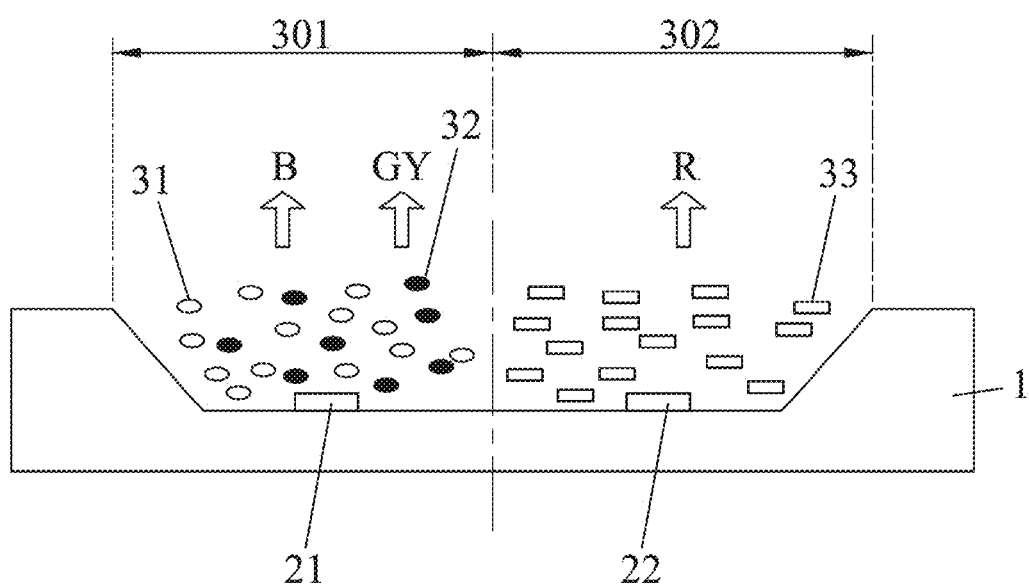
FIG. 10 is a schematic cross-sectional view illustrating a third embodiment of the LED device of the disclosure.

Referring to FIG. 10, a third embodiment of the LED device of the disclosure is similar to the second embodiment except that, the third light conversion material 32 is a green-yellow phosphor and is mixed with the first light conversion material 31 (i.e., the blue phosphor) in the first region 301 of the light conversion layer 3. In other words, the first region 301 includes the blue phosphor and the green-yellow phosphor that are excited by the first excitation light to emit the first and third excited lights, respectively, and the second region 302 includes the second light conversion material 33 (i.e., the red phosphor) that is excited by the second excitation light to emit the second excited light. The green-yellow phosphor 32 may be alkali silicate phosphors doped with Eu, which may be excited by an excitation light having a maximum emission peak wavelength of 410 nm (such as the first excitation light emitted by the first chip 21) to emit the third excited light having an emission peak wavelength ranging from 500 nm to 600 nm (i.e., green-yellow light shown as "GY" in the figures), e.g., 540 nm to 560 nm, and to achieve a maximum excitation efficiency.

Figure 11:
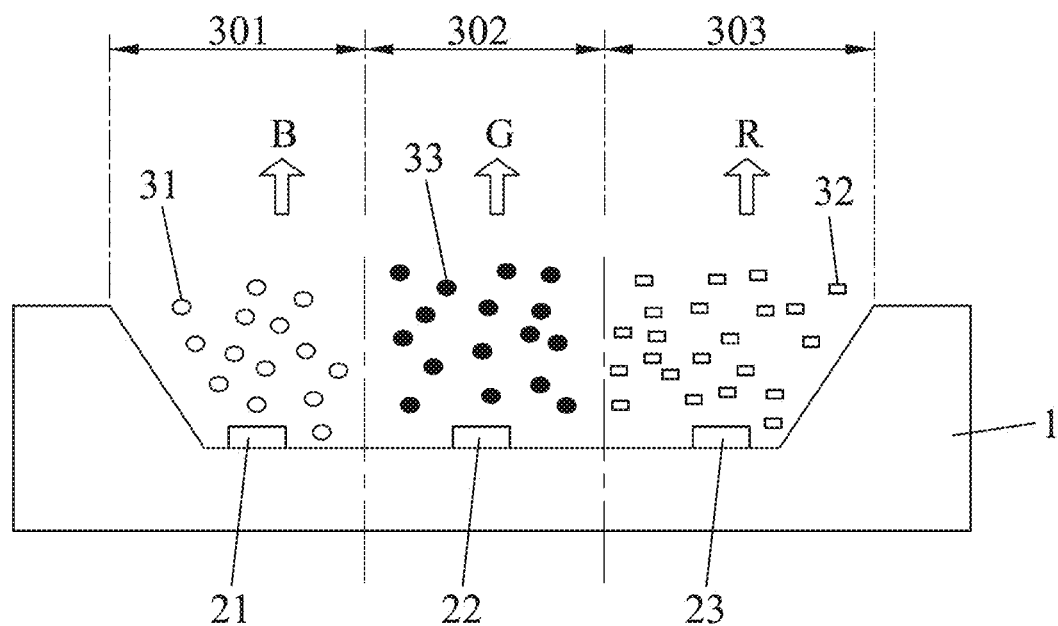
FIG. 11 is a schematic cross-sectional view illustrating a fourth embodiment of the LED device of the disclosure.

Referring to FIG. 11, a fourth embodiment of the LED device of the disclosure is similar to the third embodiment except that in the fourth embodiment, the LED chip unit 2 further includes a third chip 23 which emits a third excitation light having an emission peak wavelength that is greater than that of the second excitation light. In this embodiment, the third chip 23 is a green chip which emits the third excitation light having an emission peak wavelength ranging from 520 nm to 570 nm. The light conversion layer 3 further has a third region 303 which is disposed above and corresponding in position to the third chip 23 and which includes the third light conversion material 32 excited by the third excitation light to emit the third excited light. The first, second and third light conversion material 31, 33, 32 are the blue phosphor, the green phosphor and the red phosphor, respectively. To be specific, the blue phosphor may be excited by an excitation light having an emission peak wavelength of 390 nm (i.e., the first excitation light emitted by the first chip 21) to emit the first excited light having an emission peak wavelength of 460 nm, and achieve a maximum excitation efficiency greater than 80% at about 450 nm. The red phosphor may be a CaAlSiN3:Eu2+ (CASN) phosphor which may be excited by an excitation light having an emission peak wavelength of approximately 450 nm or 550 nm to emit the third excited light having an emission peak wavelength larger than 600 nm and achieve a maximum excitation efficiency greater than 80% at about 550 nm. The green phosphor may be the LuAG:Ce phosphor, which may achieve a maximum excitation efficiency greater than 80% at about 450 nm. In other words, in this embodiment, since the blue, green, and red phosphors are separately disposed above the first chip 21 (i.e., the violet chip), the second chip 22 (i.e., the blue chip), and the third chip 23 (i.e., the green chip), each of the blue, green, and red phosphors can achieve a maximum excitation efficiency of higher than 80%.

Figure 12:
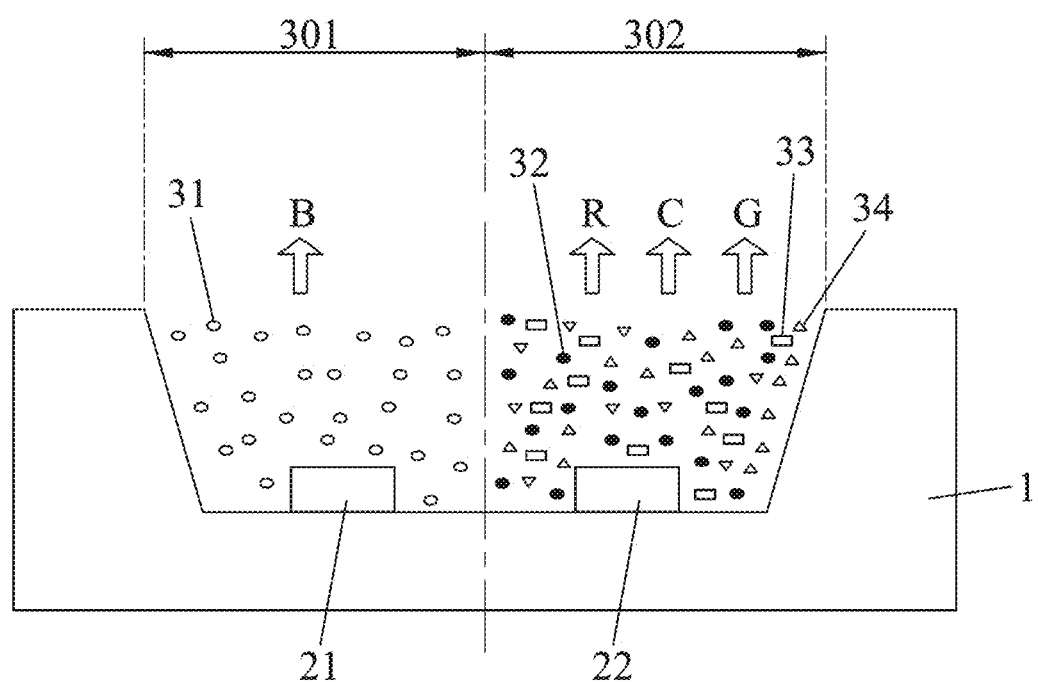
FIG. 12 is a schematic cross-sectional view illustrating a fifth embodiment of the LED device of the disclosure.

Referring to FIG. 12, a fifth embodiment of the LED device of the disclosure is similar to the second embodiment except that in the fifth embodiment, the second region 302 of the light conversion layer 3 further includes a fourth light conversion material 34 that is mixed with the second and third light conversion materials 33, 32. In this embodiment, the fourth light conversion material 34 is a cyan phosphor 34, which may be a $Li_2MgGeO_4$ phosphor doped with europium and which can be excited by an excitation light having an emission peak wavelength of 460 nm to emit a fourth excited light having an emission peak wavelength of 500 nm. It should be noted that, in certain embodiments, the first light conversion material 31 is mixed with the second to fourth light conversion materials 33, 32, 34 in the light conversion layer 3, which is disposed on the first and second chips 21, 22 similar to the first embodiment.

Figure 13:
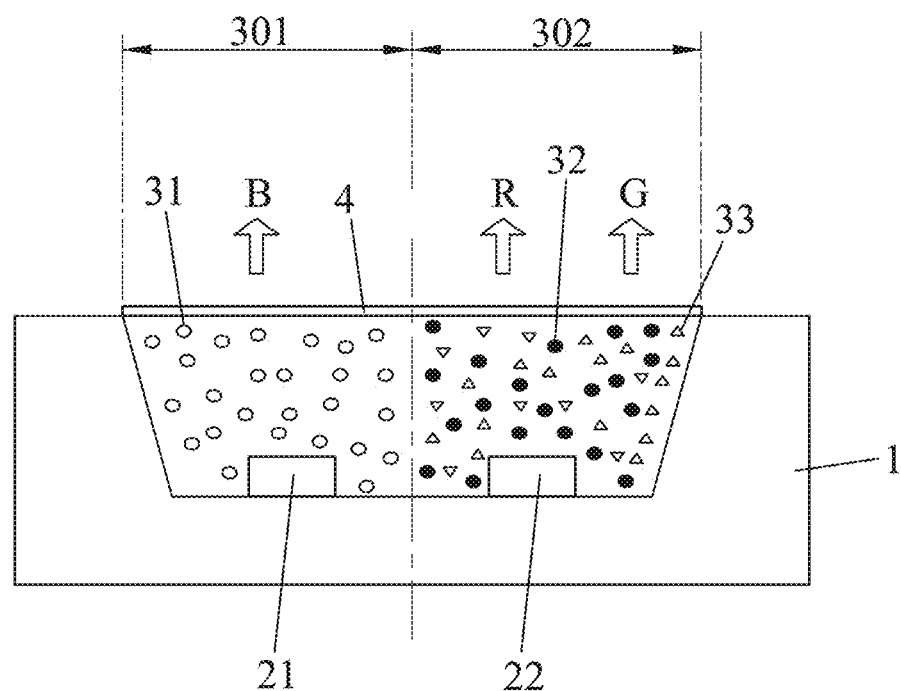
FIG. 13 is a schematic cross-sectional view illustrating a sixth embodiment of the LED device of the disclosure.

Referring to FIG. 13, a sixth embodiment of the LED device of the disclosure is similar to the second embodiment except that, the sixth embodiment of the LED device further includes a protection layer 4 which covers the light conversion layer 3 to prevent the moisture and air from entering into the LED device, so as to protect metal components of the base plate 1 from being damaged (such as vulcanization).

In sum, by inclusion of the first and second chips 21, 22 that emit the first and second excitation lights having different emission peak wavelengths, and the light conversion layer 3 that covers the first and second chips 21, 22 and converts the first and second excitation lights to excited lights having different emission peak wavelengths ranging from 440 nm to 700 nm, the LED device according to the disclosure not only emits white light having a continuous light emission spectrum similar to natural light and has an improved color rendering index, but also has an enhanced light extraction efficiency and a reduced blue light hazard.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light-emitting diode (LED) device, comprising:
   a base plate;
   an LED chip unit which is disposed on said base plate, and which includes a first chip, and a second chip, and a third chip, said first chip emitting a first excitation light, said second chip emitting a second excitation light having an emission peak wavelength greater than that of the first excitation light, said third chip emitting a third excitation light having an emission peak wavelength greater than that of the second excitation light; and a light conversion layer which is disposed on and covers said LED chip unit, and which is configured to convert the first and second excitation lights to excited lights having different emission peak wavelengths, each of which ranges from 440 nm to 700 nm, wherein a mixture of the excited lights is white light, wherein the emission peak wavelength of the first excitation light ranges from 400 nm to 425 nm, the emission peak wavelength of the second excitation light is greater than 425 nm and not greater than 460 nm, and the emission peak wavelength of the third excitation light is from 520 nm to 570 nm.

2. The light-emitting diode device according to claim 1, wherein the excited lights include a first excited light and a second excited light, and said light conversion layer includes a first light conversion material that is excited by the first excitation light to emit the first excited light, and a second light conversion material that is excited by the second excitation light to emit the second excited light.

3. The light-emitting diode device according to claim 2, wherein the excited lights further include a third excited light and said light conversion layer further includes a third light conversion material which is excited by one of the first and second excitation lights to emit the third excited light having an emission peak wavelength different from those of the first and second excited lights.

4. The light-emitting diode device according to claim 3, wherein the emission peak wavelength of the first excited light ranges from 450 nm to 500 nm, the emission peak wavelength of the second excited light is greater than 500 nm and not greater than 600 nm, and the emission peak wavelength of the third excited light is greater than 600 nm and not greater than 700 nm.

5. The light-emitting diode device according to claim 3, wherein not greater than 50% of one of the first, second and third excited lights emitted from said first, second, and third light conversion materials is absorbed by another one of said first, second, and third light conversion materials.

6. The light-emitting diode device according to claim 3, wherein one of said first, second, and third light conversion materials has an excitation efficiency of not greater than 70% at an emission peak wavelength of the excited light emitted from another one of said first, second, and third light conversion materials.

7. The light-emitting diode device according to claim 2, wherein said second light conversion material has an excitation efficiency of not greater than 70% at an excitation wavelength that is equal to the emission peak wavelength of the first excitation light, and an excitation efficiency of greater than 80% at an excitation wavelength that is equal to the emission peak wavelength of the second excitation light.

8. The light-emitting diode device according to claim 1, wherein said light conversion layer has a first region disposed above and corresponding in position to said first chip and a second region disposed above and corresponding in position to said second chip, said first region being excited by the first excitation light to emit at least one of the excited lights having an emission peak wavelength ranging from 440 nm to 600 nm, said second region being excited by the second excitation light to emit at least one of the excited lights having an emission peak wavelength ranging from 500 nm to 700 nm.

9. The light-emitting diode device according to claim 8, wherein the excited lights include a first excited light and a second excited light, and said first region includes a first light conversion material that is excited by the first excitation light to emit the first excited light, and said second region includes a second light conversion material that is excited by the second excitation light to emit the second excited light.

10. The light-emitting diode device according to claim 9, wherein the excited lights further include a third excited light, and one of said first region and said second region further includes a third light conversion material that is excited by a corresponding one of the first and second excitation lights to emit the third excited light.

11. The light-emitting diode device according to claim 1, wherein assuming that a light emission spectrum of the white light emitted by said LED device is $P(\lambda)$, and a light emission spectrum of a black-body radiation having a same color temperature as that of the white light is $B(\lambda)$, a degree of similarity between $P(\lambda)$ and $B(\lambda)$, which is determined by measuring cosine of an angle ($\theta$) between a spectral vector of $P(\lambda)$ and a spectral vector of $B(\lambda)$ within an emission wavelength range ($\lambda$) from 380 nm to 780 nm, satisfies relational equations of:

$$\cos\theta > 0.9 \text{ and } \frac{|P(\lambda)|}{|B(\lambda)|} > 0.75, \text{ where}$$

$$\cos\theta = \frac{\sum_{380}^{780} P(\lambda)B(\lambda)}{\sqrt{\sum_{380}^{780} P(\lambda)^2} \sqrt{\sum_{380}^{780} P(\lambda)^2}}$$

12. The light-emitting diode device according to claim 1, wherein assuming that a light emission spectrum of the white light emitted by said LED device is $P(\lambda)$, and a light emission spectrum of a black-body radiation having a same color temperature as that of the white light is $B(\lambda)$, a degree of similarity between $P(\lambda)$ and $B(\lambda)$, which is determined by measuring an angle ($\alpha$) between a spectral vector of $P(\lambda)$ and a spectral vector of $B(\lambda)$ within an emission wavelength range ($\lambda$) from 510 nm to 610 nm, satisfies relational equations of:

$$\cos\alpha > 0.99 \text{ and } \frac{|P(\lambda)|}{|B(\lambda)|} > 0.9, \text{ where}$$

$$\cos\alpha = \frac{\sum_{510}^{610} P(\lambda)B(\lambda)}{\sqrt{\sum_{510}^{610} P(\lambda)^2} \sqrt{\sum_{510}^{610} P(\lambda)^2}}.$$

13. The light-emitting diode device according to claim 1, wherein assuming that a light emission spectrum of the white light is $P(\lambda)$, a light emission spectrum of a black-body radiation having a same color temperature as that of the white light is $B(\lambda)$, a maximum light intensity of the white light within an emission wavelength range of 380 nm to 780 nm is $P(\lambda_{max})$, and a maximum light intensity of the black-body radiation within the emission wavelength range of 380 nm to 780 nm is $B(\lambda_{max})$, $D_1(\lambda)$, which represents a difference between $P(\lambda)$ and $B(\lambda)$ measured within an emission wavelength range ($\lambda$) from 510 nm to 610 nm, satisfies a relationship of $-0.15 < D_1(\lambda) < 0.15$, where $$D_1(\lambda) = \frac{P(\lambda)}{P(\lambda_{max})} - \frac{B(\lambda)}{B(\lambda_{max})}.$$

14. The light-emitting diode device according to claim 1, wherein assuming that a light emission spectrum of the white light is $P(\lambda)$, and a light emission spectrum of a black-body radiation having a same color temperature as that of the white light is $B(\lambda)$, $D_2(\lambda)$, which represents a difference between $P(\lambda)$ and $B(\lambda)$ measured within a wavelength range ($\lambda$) from 400 nm to 500 nm, satisfies a relationship of $-0.25 < D_2(\lambda) < 0.25$, where $$D_2(\lambda) = \frac{P(\lambda)}{P(550\ nm)} - \frac{B(\lambda)}{B(550\ nm)}.$$

15. The light-emitting diode device according to claim 1, wherein the emission peak wavelength of the second excitation light ranges from 440 nm to 460 nm.

16. The light-emitting diode device according to claim 1, wherein the excited lights further include a third excited light, and said light conversion layer further includes a third light conversion material that is excited by the third excitation light to emit the third excited light.

17. The light-emitting diode device according to claim 16, wherein:
said light conversion layer has distinct first, second and third regions;
said first region is disposed above and corresponding in position to said first chip, and includes said first light conversion material;
said second region is disposed above and corresponding in position to said second chip, and includes said second light conversion material; and
said third region is disposed above and corresponding in position to said third chip, and includes said third light conversion material.

18. The light-emitting diode device according to claim 1, wherein each of the excited lights has a full width half maximum that ranges from 30 nm to 80 nm.

19. A white light emitting system, comprising:
a light-emitting diode device according to claim 1.

* * * * *